United States Patent
Fang et al.

[11] Patent Number: 5,872,066
[45] Date of Patent: Feb. 16, 1999

[54] METHOD OF FORMING INTER-METAL DIELECTRIC LAYER FOR WVIA PROCESS

[75] Inventors: Cheng-Yu Fang; Kuo-Liang Huang, both of Hsinchu; Ching-Gji Hsu, Miao-Li; Yung-Chieh Fan, Hsinchu, all of Taiwan

[73] Assignee: United Microelectronics Corp., Hsinchu, Taiwan

[21] Appl. No.: 103,860

[22] Filed: Jun. 24, 1998

[30] Foreign Application Priority Data

May 18, 1998 [TW] Taiwan ................... 87107655

[51] Int. Cl.$^6$ ............... H01L 21/31; H01L 21/469; H01L 21/4763; B05D 3/02

[52] U.S. Cl. ............... 438/787; 438/782; 438/624; 427/387

[58] Field of Search .................. 438/781, 782, 438/622, 623, 624, 783, 788; 427/387

[56] References Cited

U.S. PATENT DOCUMENTS

| | | | |
|---|---|---|---|
| 5,320,868 | 6/1994 | Ballance et al. | 427/228 |
| 5,530,293 | 6/1996 | Cohen et al. | 257/752 |
| 5,607,773 | 3/1997 | Ahlburn et al. | 428/427 |
| 5,665,849 | 9/1997 | Cho | 528/31 |
| 5,750,403 | 5/1998 | Inoue et al. | 438/787 |

*Primary Examiner*—Brian Dutton
*Attorney, Agent, or Firm*—Thomas, Kayden, Horstemeyer & Risley, L.L.P.

[57] ABSTRACT

A method of forming an inter-metal dielectric layer using hydrogen silsesquoxane (HSQ) as one of the dielectric layers. HSQ is a highly fluidic material that has a high gap-filling capacity. Therefore, the desired thickness and uniformity can be obtained in a single coating operation. Furthermore, when the HSQ layer is cured in an atmosphere of gaseous nitrogen, the HSQ layer is able to attain a high degree of planarity. Consequently, there is no need to planarize the dielectric layer before carrying out subsequent operations.

10 Claims, 3 Drawing Sheets

METHOD OF FORMING INTER-METAL DIELECTRIC LAYER FOR WVIA PROCESS

CROSS-REFERENCE TO RELATED APPLICATION

This application claims the priority benefit of Taiwan application serial no. 87107655, filed May 18, 1998, the full disclosure of which is incorporated herein by reference.

BACKGROUND OF THE INVENTION

1. Field of Invention

The present invention relates to a method of forming inter-metal dielectric (IMD). More particularly, the present invention relates to a method of forming inter-metal dielectric using an oxide material that has a fluidic property.

2. Description of Related Art

As the level of integration of semiconductor devices in integrated circuit increases, a silicon wafer has insufficient surface area to accommodate all the necessary interconnects. Therefore, in order to prepare for the large increase in the number of interconnects resulting from the shrinkage of metal-oxide-semiconductor (MOS) transistors, designs having two or more metallic layers must be employed. However, the metallic layers have to be separated from each other by an inter-metal dielectric layer so that unnecessary short-circuiting is prevented. It can be seen that the properties, quality and planarity of the inter-metal dielectric layer are very important factors contributing to the overall quality of the MOS device.

There are two conventional methods of forming an inter-metal dielectric layer for w-via process. The first method uses a spin-on-glass (SOG) layer together with a sacrificial layer, both of which must be etched back. The second method uses deposition of spin-on-glass layer followed by a chemical-mechanical polishing (CMP) operation.

FIGS. 1A through 1C are cross-sectional views showing the progression of manufacturing steps taken to fabricate an inter-metal dielectric layer according to a conventional method that uses a spin-on glass layer and a sacrificial layer, both of which must be etched back.

First, as shown in FIG. 1A, a semiconductor substrate 10 with MOS devices (not shown) formed on it is provided. Next, a metallic layer 12 is formed over the substrate 10, and then the metallic layer 12 is patterned using photolithographic and etching operations. Thereafter, the quality of the patterned metallic layer 12 is checked in an after etching inspection (AEI). In the subsequent step, a conformal dielectric layer 14 is formed over the metallic layer 12. The conformal dielectric layer 14 can be an oxide layer formed, for example, by a plasma-enhanced chemical vapor deposition (PECVD) method. Next, a spin-on-glass layer 15 is coated on top of the dielectric layer 14. Two or three spin-coating operations are necessary to coat the spin-on glass layer 15 onto the dielectric layer 14, in order to obtain the desired uniformity and thickness for the spin-on-glass layer 15. Finally, the spin-on-glass layer 15 has to be cured so that its density is increased and a structural form close to that of silicon dioxide (SiO$_2$) is obtained.

Next, as shown in FIG. 1B, the spin-on-glass layer 15 is etched back to form a spin-on-glass layer 15a, and then the spin-on-glass layer 15a is doped using, for example, ion implantation. Thereafter, a dielectric layer 16 is formed over the spin-on-glass layer 15a. The dielectric layer 16 can be an oxide layer formed using, for example, plasma-enhanced chemical vapor deposition. Subsequently, a sacrificial layer 17, preferably made from a dielectric material, is formed over the dielectric layer 16. Next, the sacrificial layer 17 is etched back so that a highly planarized sacrificial layer 17a is formed as shown in FIG. 1C. The dielectric layer 14, the spin-on-glass layer 15a and the dielectric layer 16 together constitute an inter-metal dielectric layer.

Finally, the inter-metal dielectric layer is patterned to form via holes. Since that part of fabrication is not directly related to the formation of an inter-metal dielectric layer, details are omitted here.

One major defect of the above conventional method is that the spin-on-glass layer has to be formed in 2 to 3 spin-coating operations. Furthermore, two etching back operations have to be conducted. Hence, it takes longer to complete manufacturing.

FIGS. 2A and 2B are cross-sectional views showing the progression of manufacturing steps taken to fabricate an inter-metal dielectric layer according to a conventional method that uses a CMP-planarized, spin-on glass layer.

First, as shown in FIG. 2A, a semiconductor substrate 20 having MOS devices (not shown) formed on it is provided. Next, a metallic layer 22 is formed over the substrate 20, and then the metallic layer 22 is patterned using photolithographic and etching operations. Thereafter, the quality of the patterned metallic layer 22 is checked in an after etching inspection (AEI). In the subsequent step, a conformal dielectric layer 24 is formed over the metallic layer 22. The conformal dielectric layer 24 can be an oxide layer formed, for example, by a plasma-enhanced chemical vapor deposition (PECVD) method. Next, a spin-on-glass layer 25 is coated on top of the dielectric layer 24. Two or three spin-coating operations are necessary to coat the spin-on-glass layer 25 onto the dielectric layer 24, in order to obtain the desired uniformity and planarity for the spin-on-glass layer 25. Finally, the spin-on-glass layer 25 has to be cured so that its density is increased and a structural form close to that of silicon dioxide (SiO$_2$) is obtained.

The spin-on-glass layer 25 is then etched back. Alternatively, the next operation is directly carried out without etching the spin-on-glass layer 25 as shown in FIG. 2A. Next, the spin-on-glass layer 25 is doped using, for example, ion implantation. Thereafter, a dielectric layer 26 is formed over the spin-on-glass layer 25. The dielectric layer 26 can be an oxide layer formed, for example, by plasma-enhanced chemical vapor deposition.

Next, as shown in FIG. 2B, the dielectric layer 26 is planarized by chemical-mechanical polishing to form a dielectric layer 26a. The dielectric layer 24, the spin-on-glass layer 25 and the dielectric layer 26a together constitute an inter-metal dielectric layer.

Finally, the inter-metal dielectric layer is patterned to form via holes. Since that part of fabrication is not directly related to the formation of an inter-metal dielectric layer, details are omitted here.

In the second method, the spin-on-glass layer still has to be formed in 2 to 3 spin-coating operations. Besides that, the dielectric layer 26 for CMP is thicker than non-CMP process. Furthermore, although the number of etching back operations is reduced, chemical-mechanical polishing equipment is expensive, and therefore increases production cost.

In addition, after a patterned photoresist layer is used to form openings in the inter-metal dielectric layer, the spin-on-glass layer absorbs moisture when the photoresist layer is subsequently removed. The moisture absorbed by the spin-on-glass layer is released in a subsequent metallization process, causing outgassing. Outgassing leads to via hole poisoning, which can make deposition of metal particularly difficult and may result in unexpected open-circuit conditions. Moreover, mechanical strength of conventional spin-on-glass material is rather low, and hence may easily form cracks.

In light of the foregoing, there is a need to provide an improved method of forming inter-metal dielectric layer.

SUMMARY OF THE INVENTION

Accordingly, the present invention provides a method of forming an inter-metal dielectric layer in which the method is capable of forming a uniformly thick spin-on-glass layer in a single spin-coating operation. Furthermore, the method does not need to be etched or chemical-mechanically polished and yet still obtains a highly planar inter-metal dielectric layer.

To achieve these and other advantages and in accordance with the purpose of the invention, as embodied and broadly described herein, the invention provides a method of forming inter-metal dielectric layer. The method includes the steps of coating a layer of hydrogen silsesquoxane (HSQ) having the required thickness and uniformity over a conformal dielectric layer, and then curing the HSQ layer. Subsequently, another dielectric layer is formed over the HSQ layer. There is no need to planarize the dielectric layer before carrying out subsequent processing operations because the original HSQ layer underneath the dielectric layer has a highly planar surface.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
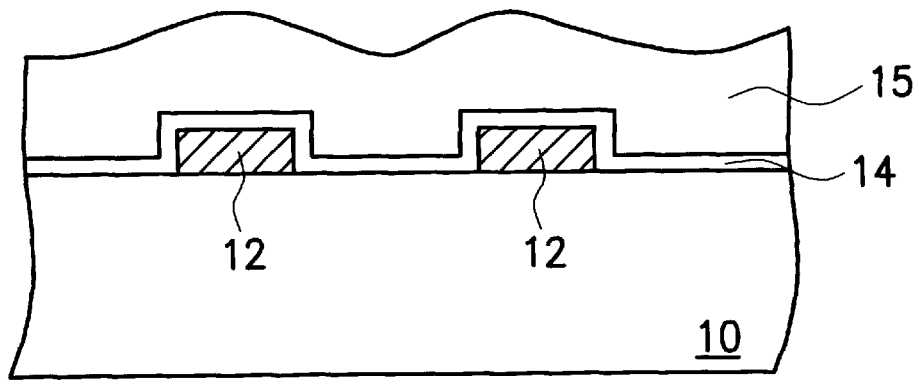
FIGS. 1A through 1C are cross-sectional views showing the progression of manufacturing steps taken to fabricate an inter-metal dielectric layer according to a conventional method that a spin-on-glass layer and a sacrificial layer, which both need to be etched back.
Figure 1B:
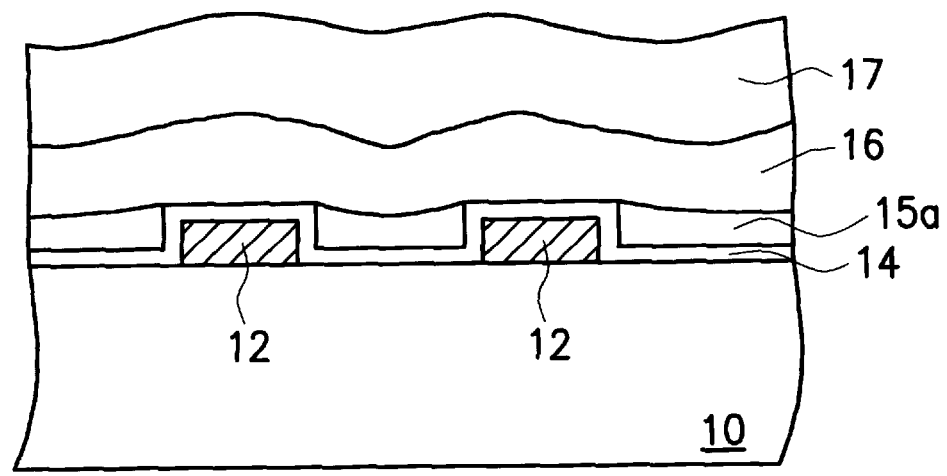
Figure 1C:
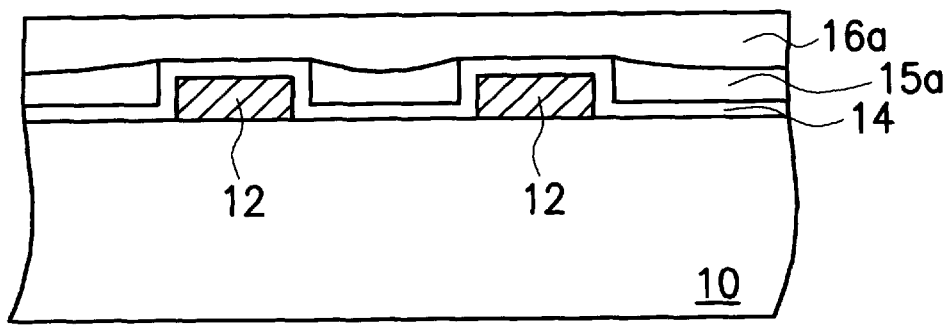
Figure 2A:
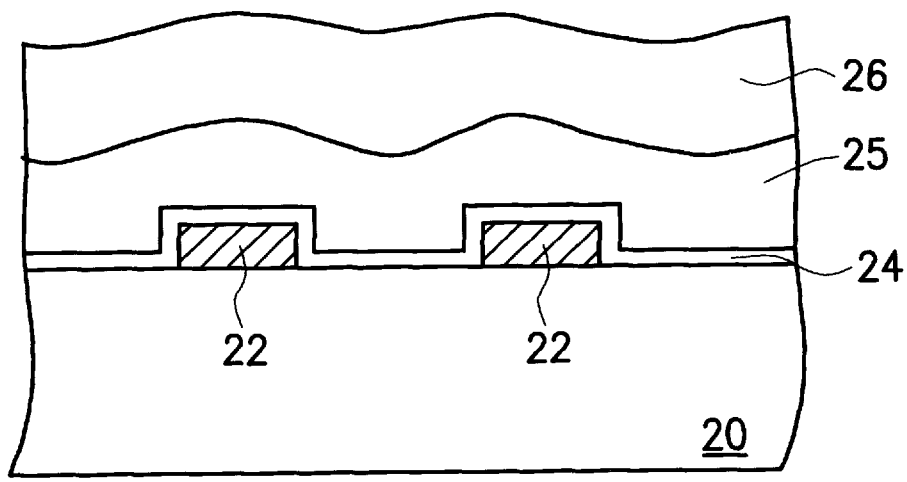
FIGS. 2A and 2B are cross-sectional views showing the progression of manufacturing steps taken to fabricate an inter-metal dielectric layer according to a conventional method that utilizes the spin-coating of a spin-on-glass layer followed by a chemical-mechanical polishing operation.
Figure 2B:
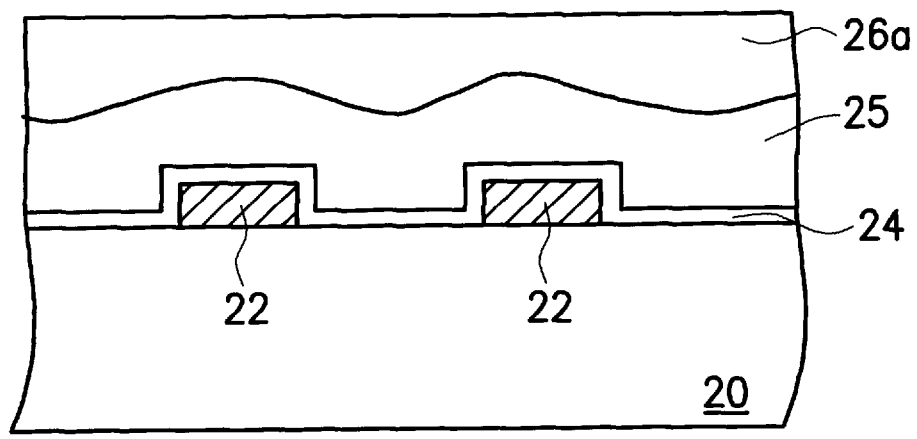

Reference will now be made in detail to the present preferred embodiments of the invention, examples of which are illustrated in the accompanying drawings. Wherever possible, the same reference numbers are used in the drawings and the description to refer to the same or like parts.

This invention uses a special gap-filling material known as hydrogen silsesquoxane (HSQ). HSQ is an oxide material that has high fluidity. When HSQ is cured, it can be up to about 95% flat.

Figure 3A:
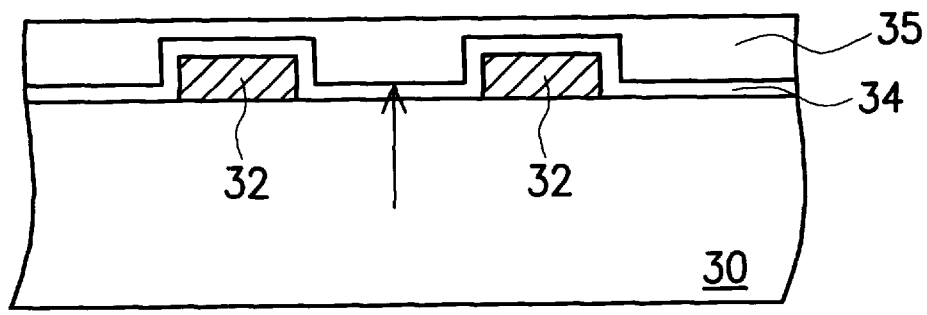
FIGS. 3A and 3B are cross-sectional views showing the progression of manufacturing steps taken to fabricate an inter-metal dielectric layer according to one preferred embodiment of this invention.
Figure 3B:
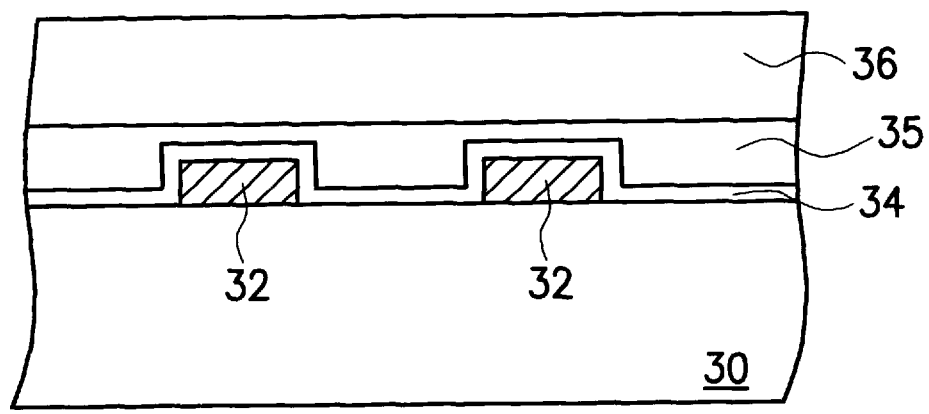

FIGS. 3A and 3B are cross-sectional views showing the progression of manufacturing steps taken to fabricate an inter-metal dielectric layer according to one preferred embodiment of this invention.

First, as shown in FIG. 3A, a semiconductor substrate 30 having MOS devices (not shown) formed on it is provided. Next, a metallic layer 32 is formed over the substrate 30, and then the metallic layer 32 is patterned using photolithographic and etching operations. Thereafter, the quality of the patterned metallic layer 32 is checked in an after etching inspection (AEI). In the subsequent step, a conformal dielectric layer 34 is formed over the metallic layer 32. The conformal dielectric layer 34 can be an oxide layer formed by plasma-enhanced chemical vapor deposition (PECVD), for example. Next, a layer of fluidic oxide material HSQ is coated over the conformal dielectric layer 34 to form a HSQ layer 35. The HSQ layer attains a desired thickness of about 5000 Å in a single coating operation.

The HSQ oxide material used in this invention is highly fluidic. Therefore, the required thickness and level of uniformity can be achieve through a single coating operation, in contrast to a conventional spin-on-glass layer, which has to be formed in 2 to 3 spin-coating operations.

Next, the HSQ layer 35 is cured so that it becomes denser and has a structural form similar to silicon dioxide. The curing process differs from a conventional curing process. Preferably, the curing of HSQ layer 35 is conducted in an atmosphere of gaseous nitrogen ($N_2$) so that the amount of Si—H bonds after curing remaining over 70% comparing with the original HSQ layer 35. Since Si—H bonding structure is able to prevent the absorption of moisture, outgassing of moisture from the HSQ layer 35 is avoided during subsequent metallization. Later, even when the photoresist layer needs to be removed by a wet etching method after being used to pattern the inter-metal dielectric layer, via holes are not contaminated. Moreover, the HSQ layer 35 has mechanical strength sufficient for the prevention of crack formation.

After curing, the HSQ layer 35 is up to about 95% flat. Therefore, there is no need to form a sacrificial layer and then performing an etching back operation, or to start a chemical-mechanical polishing operation. Hence, processing is simplified and cost of production is reduced.

Thereafter, the HSQ layer 35 is doped using, for example, phosphorus ions or arsenic ions in an ion implantation operation. The HSQ layer 35 is doped to improve the physical properties of the layer such as its capacity to prevent crack formation. Next, a dielectric layer 36 is formed over the HSQ layer 35. The dielectric layer 36 can be an oxide layer formed by plasma-enhanced chemical vapor deposition. The HSQ layer 35 and the dielectric layer 36 together form an inter-metal dielectric layer. Because the HSQ layer 35 has a high degree of planarity, the dielectric layer 36 formed on top of the HSQ layer 35 is also highly planar. Therefore, once the dielectric layer 36 is formed, subsequent operations can be immediately carried out.

Finally, the inter-metal dielectric layer is patterned to form via holes. Since that part of fabrication is not directly related to the formation of an inter-metal dielectric layer, details are omitted here.

In summary, the method of this invention has the following advantages:

1. This invention uses fluidic oxide material HSQ to make the inter-metal dielectric layer. Therefore, only one coating operation is needed to attain the desired thickness and uniformity.

2. The use of HSQ material prevents outgassing of moisture in subsequent metallization operation, and hence via hole contamination problems can be avoided.

3. HSQ material has sufficient mechanical strength, because of which it can prevent the formation of unwanted cracks.

4. The HSQ layer is up to about 95% flat, after curing. Consequently, there is no need to form a sacrificial layer and etch it back, or to start a chemical-mechanical polishing operation. As a result, the process is simplified and cost of production is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming an inter-metal dielectric layer, comprising:

forming a patterned metallic layer over a semiconductor substrate;

forming a conformal first dielectric layer over the metallic layer and the substrate;

forming a hydrogen silsesquoxane (HSQ) layer over the first dielectric layer;

curing the HSQ layer;

doping the HSQ layer; and forming a second dielectric layer over the HSQ layer, wherein the first dielectric layer, the HSQ layer and the second dielectric layer together form the inter-metal dielectric layer.

2. The method of claim 1, wherein the step of forming the first dielectric layer includes depositing oxide material.

3. The method of claim 1, wherein the step of forming the first dielectric layer includes a plasma-enhanced chemical vapor deposition method.

4. The method of claim 1, wherein the step of forming a HSQ layer over the first dielectric layer further includes coating the HSQ material over the first dielectric layer in a single operation.

5. The method of claim 1, wherein the HSQ layer has a thickness of about 5000 Å.

6. The method of claim 1, wherein the step of curing the HSQ layer includes surrounding the HSQ layer with gaseous nitrogen.

7. The method of claim 6, wherein after the step of curing the HSQ layer, the amount of Si—H bonds in the HSQ layer remains above 70% comparing with before curing.

8. The method of claim 1, wherein the step of doping the HSQ layer includes implanting phosphorus or arsenic ions.

9. The method of claim 1, wherein the step of forming the second dielectric layer includes depositing oxide material.

10. The method of claim 1, wherein the step of forming the second dielectric layer includes a plasma-enhanced chemical vapor deposition method.

* * * * *